United States Patent [19]

Ohashi et al.

[11] Patent Number: 4,896,183
[45] Date of Patent: Jan. 23, 1990

[54] IMAGE FORMATION APPARATUS WITH SUPPLEMENTAL LIGHT SOURCE

[75] Inventors: Kunio Ohashi; Syoichi Nagata; Yoshiharu Tsujimoto, all of Nara, Japan

[73] Assignee: Sharp Kabushiki Kaisha, Osaka, Japan

[21] Appl. No.: 224,927

[22] Filed: Jul. 27, 1988

[30] Foreign Application Priority Data

Aug. 7, 1987 [JP] Japan .................................. 62-198745

[51] Int. Cl.$^4$ ...................... G03B 27/32; G03B 27/52
[52] U.S. Cl. .................................... 355/27; 354/301; 355/37; 430/138
[58] Field of Search ................ 430/138; 355/27, 70, 355/37; 354/297–304

[56] References Cited

U.S. PATENT DOCUMENTS 4,255,042  3/1981  Armitage, Jr. et al. .......... 355/70 X
4,737,748  4/1988  Ito ..................................... 355/704
4,770,972  9/1988  Nelson et al. ................. 430/403 X Primary Examiner—Richard A. Wintercorn
Attorney, Agent, or Firm—Flehr, Hohbach, Test, Albritton & Herbert

[57] ABSTRACT

An image forming apparatus such as a copier of the type using a light and pressure sensitive material to form a visible image by exposing photosensitive microcapsules to image forming light to thereby form an invisible pattern of selectively hardened microcapsules and pressing these microcapsules against a transfer sheet superposed thereon to rupture the microcapulses according to the pattern to effect chromogenic reactions selectively, is provided with a supplemental light source for exposing areas of the material not intended for forming an image such that unnecessary microcapsules in these areas do not cause stains on components of the apparatus.

8 Claims, 2 Drawing Sheets

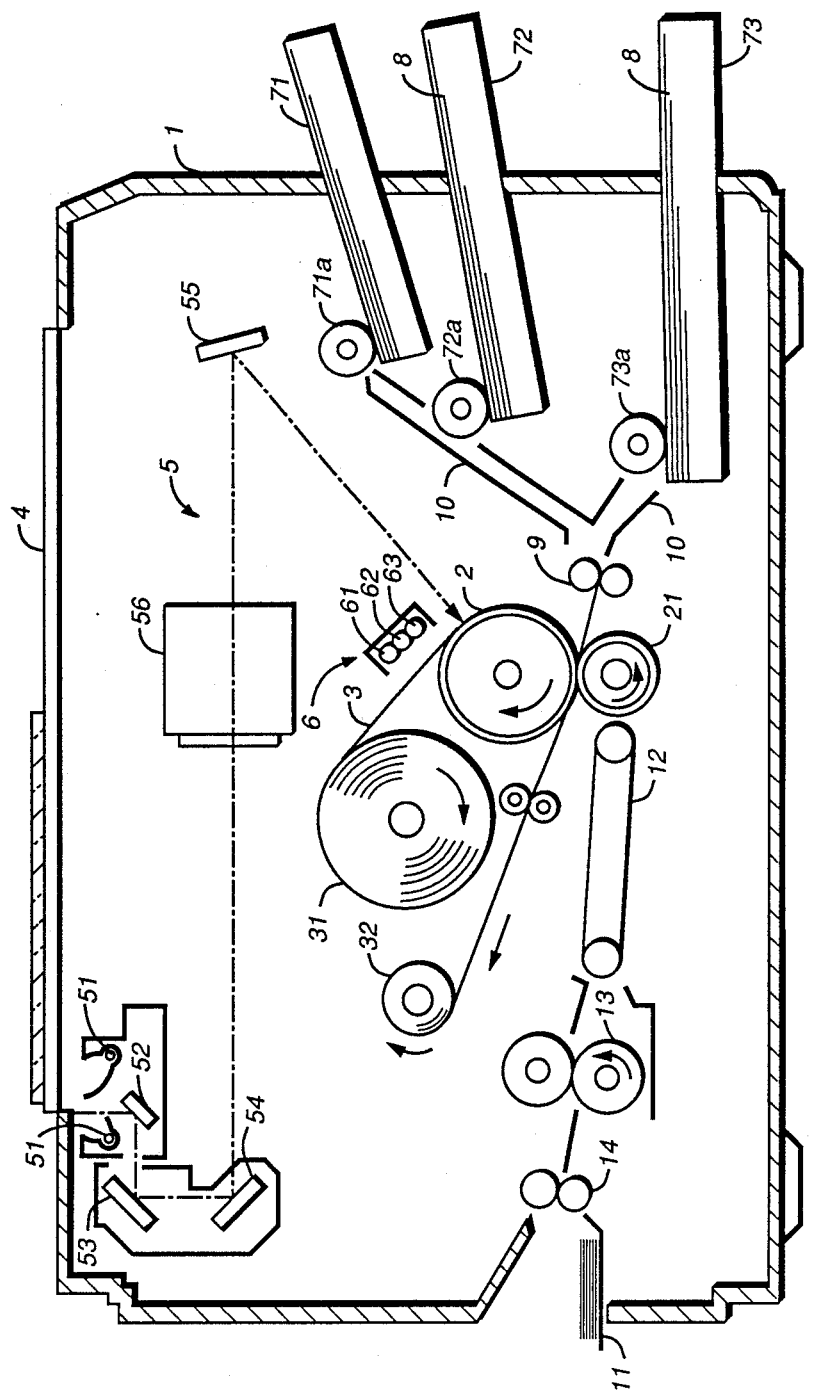
FIG._1

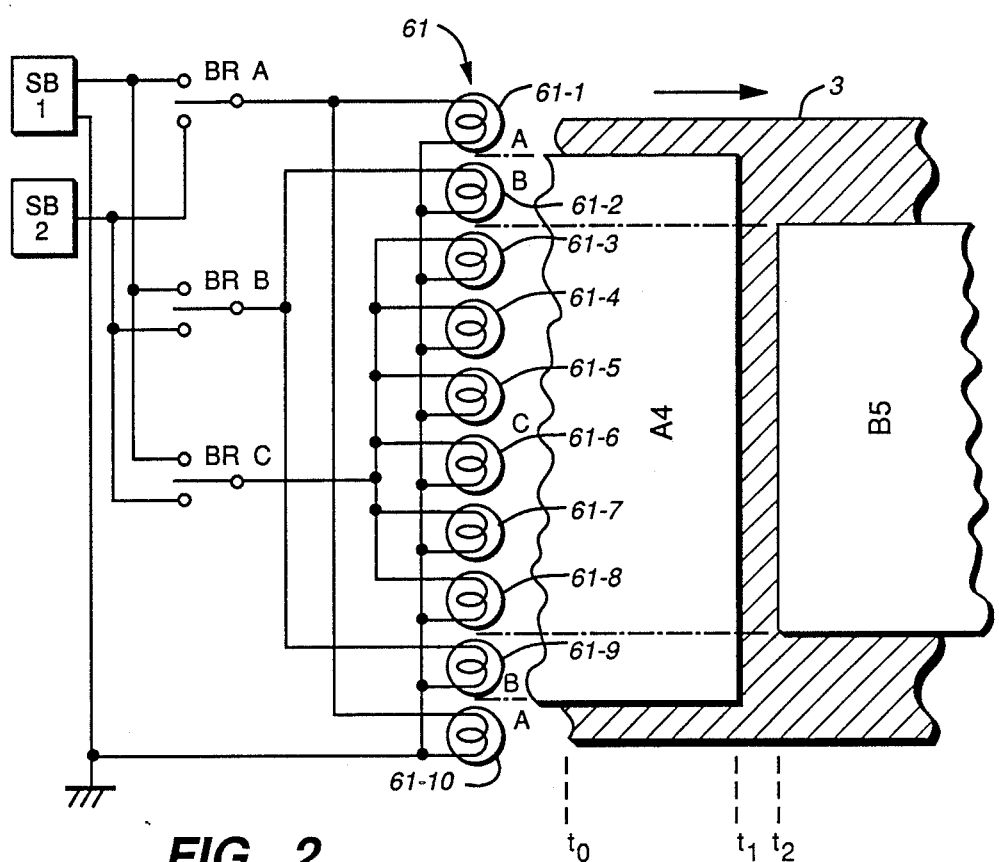
FIG._2
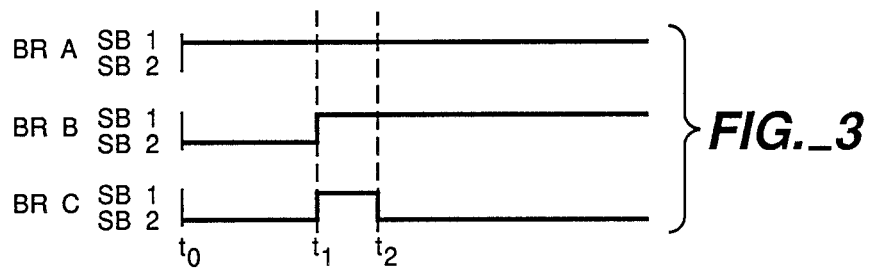
FIG._3
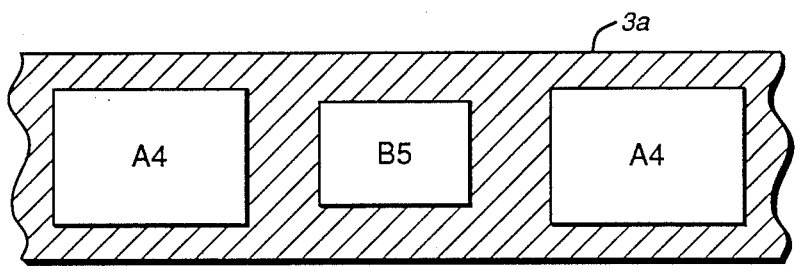
FIG._4

IMAGE FORMATION APPARATUS WITH SUPPLEMENTAL LIGHT SOURCE

BACKGROUND OF THE INVENTION

This invention relates to an apparatus for forming a visible image by chromogenic reaction of a colorless dye encapsulated in microcapsules and more particularly to such an image formation apparatus used for a copier or a printer adapted to prevent stains caused by rupture of unnecessary microcapsules.

Japanese Patent Publications Tokkai No. 58-88739 and 59-149343 have disclosed a light and pressure sensitive image formation material composed of a light-accepting sheet having a base sheet coated with microcapsules encapsulating a substance which hardens upon exposure to light and a colorless dye and an image transfer sheet coated with a developer material having chromogenic effects on the colorless dye. To briefly explain the method of image formation by using such a light and pressure sensitive material, an image-forming beam of light reflected, for example, from an original document is made incident on the light-accepting sheet to selectively harden those of the microcapsules exposed to light. If the image transfer sheet is thereafter superposed on the light-accepting sheet and pressed together between rollers, for example, those of the microcapsules not exposed to light and not hardened thereby are ruptured and allow the encapsulated colorless dye to flow out and react chromogenically with the developer material on the image transfer sheet.

When a light-accepting sheet with an invisible image formed thereon by selectively hardened microcapsules and an image transfer sheet superposed and pressed together, however, those microcapsules contacting the external edge areas of the image transfer sheet sometimes rupture and stain the rollers and the like. If the image formation apparatus is of the type which uses light-accepting sheets in the form of a roll, images of sizes A4 and B5, for example, are formed generally as shown in FIG. 4 wherein areas of a light-accepting sheet 3a where no image is formed and where microcapsules are not hardened are hatched for convenience. An image transfer sheet, however, is superposed to cover only an image-carrying area (shown unhatched in FIG. 4) of the light-accepting sheet 3a. Thus, if a roll of light-accepting sheet in a condition as shown in FIG. 4 is compressed between rollers with only the image-carrying area superposed with an image transfer sheet, those of the microcapsules which are in non-image-carrying areas and hence are not hardened rupture, spilling out the encapsulated colorless dye.

If the colorless dye spills on the rollers for compressing the sheets, it may become attached to the back surface of the next image transfer sheet delivered to receive an image. In order to prevent this from happening, a special cleaning device may be required or the apparatus may have to be serviced frequently. Such a cleaning device makes the apparatus complicated and also expensive to manufacture. Requirement of frequent maintenance work, on the other hand, adds burden to the user.

SUMMARY OF THE INVENTION

It is therefore an object of the present invention to provide an image formation apparatus of the type using a light and pressure sensitive material which does not require a cleaning device or a frequent maintenance work in view of stains caused by rupturing of unnecessary microcapsules.

The above and other objects of the present invention are achieved by providing such an apparatus with a supplemental light source for exposing to light areas of the material which are not intended for forming an image such as along the edges.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a schematic sectional view of a copier embodying the present invention, FIG. 2 is a schematic drawing showing the positional and functional relationship between lamps of the supplemental light source of the present invention and a light-accepting sheet, FIG. 3 is an example for the operation of the supplemental light source of FIG. 2, and FIG. 4 is a plan view of a portion of light-accepting sheet showing its image-forming areas and non-image-forming areas.

DETAILED DESCRIPTION OF THE INVENTION

FIG. 1 shows a copier embodying the present invention for using a roll of light-accepting sheet uniformly coated with three kinds of microcapsules (hereinafter referred to as Y capsules, M capsules and C capsules which respectively respond to blue (B), green (G) and red (R) light to become yellow (Y), magenta (M) and cyanic (C)). As will be described in detail below, this copier is characterized as having a supplemental light source unit including three types of light sources (B, G and R) such that microcapsules in non-image-forming areas are hardened and also that color corrections of image can be achieved. Color corrections mean correcting photosensitivity characteristics of the Y, M and C capsules to prevent dominance of any particular color and to improve reproducibility of intermediate colors.

As shown in FIG. 1, a main drum 2 is disposed approximately at the center of a housing structure 1. Disposed to the left of the main drum 2 are a loading roller 31 around which a roll of light-accepting sheet 3 is carried and a take-up roller 32 for taking up sed light-accepting sheet 3 such that one end of the roll of light-accepting sheet 3 is passed partially around the surface of the main drum 2 and wound around the take-up roller 32. The light-accepting sheet 3 is made of a base sheet of polyester or the like uniformly coated with Y, M and C capsules, having a width of 223mm (slightly longer than the width of a sheet of size A4). The light-accepting sheet 3 is so wound around the rollers 31 and 32 that its surface coated with the microcapsules face outward as it is passed around the main drum 2. The light-accepting sheet 3 is replaced by removing both the loading and take-up rollers 31 and 32 from the housing structure 1. Numeral 21 indicates a pressure-applying roller pressed against the main drum 2 from below.

At the top of the housing structure 1 is a document table 4 below which is an optical system 5 of a usual type found in prior art copiers, including a scanning lamp 51, mirrors 52-55 and a lens 56. The optical system 5 serves to scan a document on the document table 4 and to direct reflected light therefrom by way of the mirrors 52–55 and the lens 56 onto an exposure point P on the main drum 2 to be made incident on the light-accepting sheet 3.

A supplemental light source unit 6 characterizing the present invention is disposed such that the light-accepting sheet 3 comes opposite thereto immediately before it reaches the exposure point P. The supplemental light source unit 6 includes light sources 61, 62 and 63 of three kinds having B, G and R filters in front of tungsten lamps or the like. Each of these three light sources 61, 62 an 63 is composed of a row of lamps arranged in the direction of the width of the light-accepting sheet 3 at intervals of 20mm as will be explained more fully below such that the light-accepting sheet 3 can be exposed uniformly in the direction of this row. Each of these light sources 61, 62 and 63 is connected to a variable voltage source and is provided with its own control unit for independently controlling radiation intensity and time of exposure.

A circuit for the blue light source 61 and the positional relationship between the light source 61 and the light-accepting sheet 3 are shown in FIG. 2. The light-accepting sheet 3 is shown with images of sizes A4 and B4 formed thereon for the purpose of illustration. The light source 61 includes ten lamps 61-1–61-10 arranged in the direction of the width of the light-accepting sheet 3 as mentioned above. These ten lamps are divided into the following three blocks, depending on the document size. Block A includes the two lamps 61-1 and 61-10 at both ends of the array which are farther apart than 210mm (the width of size A4). Block B includes the two lamps 61-2 and 61-9 which are apart by less than 210mm but greater than 182mm (the width of size B5). Block C includes the remaining lamps 61-3–61-8 which are within the range of 182mm of one another. The lamps belonging to different blocks are separately controlled and power is supplied to the individual blocks through relays BRA, BRB and BRC. Two power sources SB1 and SB2 are provided, one (SB1) for applying a voltage for completely hardening Y capsules and the other (SB2) for effecting color corrections of Y capsules. Although not shown separately, the green and red light sources 62 and 63 are also similarly structured, the green light source 62 comprising ten lamps 62-1 –62-10 divided into three blocks controlled respectively by three relays GRA, GRB and GRC to be connectable to two power sources SG1 and SG2 and the red light source comprising ten lamps 63-1–63-10 divided into three blocks controlled respectively by three relays RRA, RRB and RRC to be connectable to two power sources SR1 and SR2.

Paper cassettes 71–73 are provided on the right-hand side of the housing structure 1, containing image transfer sheets 8 of sizes A4 and B5 so as to be fed in the longitudinal direction. The image transfer sheets 8 are delivered in these cassettes 71–73 which are removable from the housing structure 1 when a new supply is necessary. The image transfer sheets 8 comprise a base sheet of paper or polyester coated with a developer and are contained in these cassettes 71–73 with their coated surfaces facing upward. The developer has the chromogenic characteristics of causing colors Y, M and C to come out of the colorless dyes encapsulated in the Y, M and C capsules, respectively, upon contact with them. Paper feeder rollers 71a–73a are provided at front ends of the cassettes 71–73. Between the cassettes 71–73 and the main drum 2 are timing rollers 9. Between the timing rollers 9 and the feeder rollers 71a–73a are paper guides for directing the image transfer sheets 8 to the timing rollers 9. On the left-hand side of the housing structure 1 is a discharge tray 11. Between the main drum 2 and the discharge tray 11 are a conveyor belt 12, heat rollers 13 and discharge rollers 14, in this order. The upper one of the heat rollers 13 contains a heat source such as a halogen lamp to maintain the surface temperature of this upper roller at a specified temperature.

Inside a copier thus structured, the light-accepting sheet 3 is continuously supplied to the exposure point P by the rotations of the take-up and loading rollers 32 and 32 as well as the main drum 2. An original document to be copied is placed on top of the document table 4 and is scanned by the optical system 5 such that reflected image-forming light from the document is made incident on the light-accepting sheet 3 at the exposure point P. This exposure selectively hardens the microcapsules encapsulating a photopolymerizing substance and thereby forms an invisible image (a pattern of hardened microcapsules) in the image-forming area. In the meantime, an image transfer sheet 8 is supplied from one of the paper cassettes 71–73 through the guide 10 and stops at the position of and in contact with the timing rollers 9.

The timing rollers 9 serve to advance the image transfer sheet 8 such that it is placed over the image formation area of the light-accepting sheet 3. The superposed pile of the light-accepting sheet 3 and the image transfer sheet 8 are pressed together between the main drum 2 and the pressure applying roller 21 such that those of the microcapsules not hardened by polymerization inside are ruptured and the encapsulated colorless dyes flow out thereof onto the superposed image transfer sheet 8, resulting in chromogenic reactions to cause colors to appear and to form a visible color image. The pressure applying roller 21 is set to apply a linear pressure of 10–35kg/cm. The linear pressure is determined by the kind of photopolymerizing substance encapsulated in the microcapsules.

The image transfer sheet 8, after a color image has thus been formed thereon, is transported by the conveyor belt 12 and heated by the heat rollers 13 to a temperature of about 70–150° C. such that the chromogenic reactions of the colorless dyes can be accelerated. If the image transfer sheet 8 is coated with a thermoplastic resin, the produced color image can thereby be made lustrous as disclosed in Japanese Patent Publication Tokkai No. 60-259490. The image transfer sheet 8, after heated by the heat rollers 13, is discharged onto the discharge tray 11 by the discharge rollers 14 while the light-accepting sheet 3 is taken up by the take-up roller 32.

As broadly explained above, the supplemental light source unit 6 serves not only to harden microcapsules on the non-image-forming areas of the light-accepting sheet 2 such as along its edges by exposure to light but also to correct the photosensitivity characteristics of the Y, M and C capsules by the B, G and R light sources 61, 62 and 63. Color correction methods include the so-called gamma (change in exposure/change in density) correction and relative correction methods. The gamma correction method is effected, as disclosed in Japanese Patent Publication Tokkai No. 59-149343, by reducing the amount of oxygen inside the capsules by exposure to light and the relative correction method is to increase light exposure to those with poor sensitivity. If corrections are effected individually to the three kinds of capsules, dominance of particular colors in low and high density areas as well as tone quality can be corrected.

Hardening of microcapsules in the non-image-forming areas and color corrections (corrections on photosensitivity characteristics) are achieved proportional to the degrees of exposure to the light sources 61, 62 and 63, determined by the voltage applied thereto and the durations of exposure. According to the embodiment of the present invention shown above, the applied voltages are made variable by selectably different power sources SB1, SB2, etc. to control the degrees of exposure. An alternative method is to keep the voltages constant but vary the ON-OFF duty ratios to control the degrees of exposure by the light sources 61, 62 and 63.

A method of controlling the blue light source 61 is explained below by way of FIG. 3 which shows connections of the relays BRA, BRB and BRC corresponding to the light-accepting sheet 3 shown in FIG. 2. While an original document of size A4 is scanned (between $t_0$ and $t_1$), only the junction BRA for Block A is connected to the power source SB1 for complete hardening of capsules and the other junctions BRB and BRC for Blocks B and C are connected to the other power source SB2 for color corrections. When the area between two image-forming areas is scanned (between $t_1$ and $t_2$), all junctions BRA, BRB and BRC for Blocks A, B and C are connected to the power source SB1. When the document of size B5 is thereafter scanned (after $t_2$), the junctions BRA and BRB for Blocks A and B are connected to the power source SB1 and the junction BRC for Block C is connected to the other power source SB2. In summary, the lamps opposite to non-image-forming areas are connected to the power source SB1 for completely hardening the B capsules such that they will not rupture when they are later pressed between the main drum 2 and the pressure applying roller 21. Meanwhile, the lamps opposite to an image-forming area on the light-accepting sheet 3 are connected to the other power source SB2 for color correction of the B capsules. The green and red light sources 62 and 63 are similarly controlled and will not be explained separately although their source voltages are not the same.

Test experiments were carried out by setting the power source voltages SB1, SG1 and SR1 to 18.0V, 15.8V and 14.0V, respectively and the correction voltages SB2, SG2 and SR2 to 12.0V, 6.0V and 8.2V, respectively. The voltages were set differently for different colors because the Y, M and C capsules have different levels of photosensitivity. Gray scale documents of sizes A4 and B5 were used as originals for copying. No attachment of colorless dyes, etc. was observed on the pressure applying roller 21 because Y, M and C capsules were all completely and reliably hardened respectively by the B, G and R light beams. Color reproducibility of the produced copies was good without dominance of any color in low or high density regions. Copying tests were continued for 100 sheets but colorless dyes were observed neither on the pressure applying roller 21 nor on the back of the image transfer sheets 8. In other words, it was clearly demonstrated that no cleaning device specifically for removing the dyes was necessary.

The foregoing description of a preferred embodiment of the invention has been presented for purposes of illustration and description. It is not intended to be exhaustive or to limit the invention to the precise form disclosed, and many modifications and variations are possible in light of the above teaching. For example, the lamps in the light sources 61, 62 and 63 may be divided into more blocks, corresponding to the number of different sizes of documents to be served. The number of lamps in each light source is not limited to ten. If independent control means for the individual blocks are provided, trimming and masking can also be effected by these lamps. Likewise, arrays of 565nm and 655nm light-emitting diodes may be used as sources of green and red light. Since no blue light-emitting diode array is currently available commercially, use may be made of fluorescent lamps, cold cathode ray tubes and electroluminescent panels.

The objects of the present invention can now alternatively be achieved by providing a light source with a constant voltage applied thereon and a liquid crystal shutter. Selective hardening of capsules and color corrections can be achieved by dividing the panel of liquid crystal shutter into several parts.

Moreover, the position of the supplemental light source unit 6 inside the copier does not limit the scope of the present invention. It may be at the exposure point P itself or thereafter. Although the present invention was explained above by way of an example wherein microcapsules independently sensitive to B, G and R light and coloring in Y, M and C, the present invention is equally applicable to use of monochromatic capsules sensitive to radiation in a wider range of wavelengths or microcapsules which are sensitive to two or more colors inclusive of light outside the visible range. It goes without saying that the present invention is applicable not only to copiers but also to other image formation apparatus such as printers. Such modifications and variations that may be apparent to a person skilled in the art are intended to be included within the scope of this invention.

What is claimed is:

1. In an image formation apparatus which forms a visible image by exposing to image-forming light a light-accepting sheet coated with microcapsules encapsulating a substance which hardens by light and a colorless dye to selectively harden said microcapsules by exposure of said substance to light and to thereby form an invisible image on said light-accepting sheet, superposing thereon an image transfer sheet coated with a developer material having chromogenic effects on said colorless dye, and pressing said light-accepting sheet and said image transfer sheet together by a pressure applying device to cause unhardened ones of said microcapsules to rupture and to thereby cause said colorless dyes encapsulated in said ruptured microcapsules to chromogenically react with said developer material, the improvement wherein said apparatus comprises a supplemental light source unit including arrays of lamps emitting light of different colors, said supplemental light source unit serving to selectably expose non-image-forming areas of said light-accepting sheet to thereby harden microcapsules in said non-image-forming areas, and said supplemental light source unit serving also to correct photosensitivity characteristics of said microcapsules.

2. THe apparatus of claim 1 wherein said supplemental light source unit is disposed at an exposure point where said light-accepting sheet is exposed to said image-forming light.

3. The apparatus of claim 1 wherein said supplemental light source unit is so disposed that said light-accepting sheet passes said supplemental light source unit before reaching an exposure point where said light-accepting sheet is exposed to said image-forming light.

4. The apparatus of claim 1 wherein said supplemental light source unit is so disposed that said light-accepting sheet passes said supplemental light source unit after reaching an exposure point where said light-accepting sheet is exposed to said image-forming light.

5. The apparatus of claim 1 wherein said arrays of lamps are distributed transversely to said light-accepting sheet.

6. The apparatus of claim 5 wherein said lamps are divided into a plurality of blocks which are independently controlled.

7. The apparatus of claim 1 wherein said different colors are blue, red and green.

8. The apparatus of claim 7 wherein said microcapsules include Y capsules, M capsules and C capsules which respectively respond to blue, green and red light to become yellow, magenta and cyanic.

* * * * *